(12) United States Patent
Chen et al.

(10) Patent No.: US 7,611,807 B2
(45) Date of Patent: Nov. 3, 2009

(54) METHOD FOR FORMING POLY-SILICON FILM

(75) Inventors: Hung-Tse Chen, Hsinchu County (TW); Yu-Cheng Chen, Taipei County (TW); Fang-Tsun Chu, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 523 days.

(21) Appl. No.: 11/368,616

(22) Filed: Mar. 7, 2006

(65) Prior Publication Data

US 2007/0141478 A1   Jun. 21, 2007

(30) Foreign Application Priority Data

Dec. 19, 2005   (TW) ............................... 94145034 A

(51) Int. Cl.
G03F 1/00   (2006.01)
(52) U.S. Cl. ........................... 430/5; 438/487; 438/166
(58) Field of Classification Search .................... 430/5; 438/166, 487, 795
See application file for complete search history.

(56) References Cited

U.S. PATENT DOCUMENTS

| 6,726,768 | B2 | 4/2004 | Yoon | |
|---|---|---|---|---|
| 6,908,835 | B2 | 6/2005 | Sposili et al. | |
| 7,011,911 | B2 * | 3/2006 | Kim et al. | 430/5 |
| 2004/0053450 | A1 * | 3/2004 | Sposili et al. | 438/151 |
| 2005/0151146 | A1 * | 7/2005 | Lee et al. | 257/98 |
| 2005/0233224 | A1 * | 10/2005 | Tseng et al. | 430/5 |
| 2006/0024592 | A1 * | 2/2006 | Kim | 430/5 |
| 2007/0269993 | A1 * | 11/2007 | Chu et al. | 438/795 |

* cited by examiner

Primary Examiner—Mark F Huff
Assistant Examiner—Stewart A Fraser
(74) Attorney, Agent, or Firm—Birch, Stewart, Kolasch & Birch, LLP

(57) ABSTRACT

In the present invention, a method is used for forming a poly-silicon film that uses sequential lateral solidification (SLS) with two laser irradiations using a mask for patterning the laser beam so as to increase the grain length. The method also achieves enhancing the throughput due to the use of a mask that is designed for the method.

5 Claims, 9 Drawing Sheets

US 7,611,807 B2

METHOD FOR FORMING POLY-SILICON FILM

BACKGROUND OF THE INVENTION

1. Field of the Invention

The present invention generally relates to a method for forming a poly-silicon film and, more particularly, to a method using sequential lateral solidification (SLS) with two laser irradiations using a mask for patterning the laser beam so as to increase the grain length.

2. Description of the Prior Art

In semiconductor manufacturing, amorphous silicon (a-Si) thin-film transistors (TFTs) are now widely used in the liquid crystal display (LCD) industry because a-Si films can be deposited on a glass substrate at low temperatures. However, the carrier mobility in an a-Si film is much lower than that in a poly-silicon (p-Si) film, so that conventional a-Si TFT-LCDs exhibit a relatively slow response time that limits their suitability for large area LCD devices. Accordingly, there have been lots of reports on converting low-temperature grown a-Si films into p-Si films using laser annealing.

Presently, p-Si films are used in advanced electronic devices such as solar cells, LCDs and organic light-emitting devices (OLEDs). The quality of a p-Si film depends on the size of the crystal grains that form the p-Si film. It is thus the greatest challenge to manufacture p-Si films having large grains with high throughput.

FIG. 1A is a conventional system for forming a p-Si film using sequential lateral solidification (SLS). The system comprises: a laser generator 11 for generating a laser beam 12 and a mask 13 disposed in a traveling path of the laser beam 12. The mask has a plurality of transparent regions 13a and a plurality of opaque regions 13b. Each of the plurality of transparent regions 13a is a stripe region with a width W. The laser beam 12 passing through the transparent regions 13a irradiates an a-Si film 15 on the substrate 14 in back of the mask 13 so as to melt the a-Si film 15 in the stripe regions 15a with a width W. As the laser beam 12 is removed, the melted a-Si film 15 in the stripe regions 15a starts to solidify and re-crystallize to form laterally grown silicon grains. Primary grain boundaries 16 parallel to a long side of the stripe regions 15a are thus formed at the center of the stripe regions 15a and a p-Si film is formed to have crystal grains with a grain length equal to a half of the width W, as shown in 1B.

In order to enhance the throughput, U.S. Pat. No. 6,908,835 discloses a method for forming a poly-silicon film using sequential lateral solidification with two laser irradiations. In U.S. Pat. No. 6,908,835, a mask is used to pattern the laser beam and thus control the grain length, as shown in FIG. 2A and FIG. 2C.

In FIG. 2A, the mask 20 comprises a plurality of first stripe-shaped transparent regions 21 and a plurality of second stripe-shaped transparent regions 22 so that an a-Si film (not shown) on a substrate (not shown) in back of the mask 20 undergoes two laser irradiations while moving relatively to the mask 20 along X-axis. In FIG. 2B, it is given that each of the first and the second transparent regions 21 and 22 has a width W. The spacing between two adjacent first transparent regions 21 and between two adjacent second transparent regions 22 is S. An offset width OS appears between the first transparent regions and the second transparent regions, where $OS \geq \frac{1}{2} W$. Therefore, the distance $\lambda$ between a first primary grain boundary (corresponding to a central line 211 in the first transparent regions 21) obtained after SLS using the first laser irradiation and a second primary grain boundary (corresponding to a central line 221 in the first transparent regions 22) obtained after SLS using the second laser irradiation is $\lambda=(W+S)/2$.

In practical cases, however, the system for forming a p-Si film in FIG. 1A can further comprise a projection lens apparatus (not shown) disposed on the traveling path of the laser beam 12 between the substrate 14 and the mask 13. Given that the projection lens apparatus has an amplification factor of N, the grown p-Si film has crystal grains that have a grain length of $\lambda/N$. For example, if W=27.5 μm, S=7.5 μm and N=5, the grain length of the p-Si film is $\lambda/N=[(W+S)/2]/5=3.5$ μm, as shown in FIG. 2C.

In order to obtain a larger grain length, U.S. Pat. No. 6,726,768 discloses a method for forming a poly-silicon film using sequential lateral solidification with multiple laser irradiations. In U.S. Pat. No. 6,726,768, a mask is used to pattern the laser beam and thus control the grain length, as shown in FIG. 3. In FIG. 3, the mask 30 comprises a plurality of first transparent regions 31, a plurality of second transparent regions 32, a plurality of third transparent regions 33, a plurality of fourth transparent regions 34 and a plurality of fifth transparent regions 35, so that an a-Si film (not shown) on a substrate (not shown) in back of the mask 30 undergoes multiple laser irradiations while moving relatively to the mask 30 along X-axis. Even though a larger grain length of crystal grains may be obtained using the method disclosed in U.S. Pat. No. 6,726,768, it takes longer time and results in low throughput.

Therefore, there exists a need in providing a method for forming a poly-silicon film, using sequential lateral solidification (SLS) with two laser irradiations using a mask for patterning the laser beam so as to increase the grain length.

SUMMARY OF THE INVENTION

It is a primary object of the present invention to provide a method for forming a poly-silicon film, using sequential lateral solidification (SLS) with two laser irradiations using a mask for patterning the laser beam so as to increase the grain length.

It is another object of the present invention to provide a method for forming a poly-silicon film, using sequential lateral solidification (SLS) with two laser irradiations using a mask for patterning the laser beam so as to enhance the throughput.

In order to achieve the foregoing object, the present invention provides a method for forming an electrode, the method comprising steps of:

providing a system for forming a poly-silicon film, comprising
a laser generator for generating a laser beam; and
a mask disposed in a traveling path of the laser beam, the mask including a plurality of first transparent regions with a spacing S and a plurality of second transparent regions with a spacing S, each transparent region having a width W and a length L, wherein the first transparent regions are adjacent to the second transparent regions and a central line of each first transparent region extends along the length L into one of the second transparent regions such that an offset width OS appears between the first transparent regions and the second transparent regions;

providing a substrate with an amorphous silicon film formed thereon behind the mask in the traveling path of the laser beam;

performing a first laser irradiation process on the amorphous silicon film using the laser beam irradiating through the mask so as to melt the amorphous silicon film in a plurality of first stripe-shaped regions corresponding to the first transparent regions on the mask;

removing the laser beam such that the melted amorphous silicon film in the first stripe-shaped regions turns into a poly-silicon film with a first grain length;

moving the substrate along the length L for a distance no longer than the length L such that the plurality of first stripe-shaped regions correspond to the plurality of second transparent regions on the mask;

performing a second laser irradiation process on the poly-silicon film using the laser beam irradiating through the mask so as to re-melt the poly-silicon film in a plurality of first stripe-shaped regions corresponding to the second transparent regions on the mask; and removing the laser beam such that the re-melted poly-silicon film in the first stripe-shaped regions turns into a poly-silicon film with a second grain length.

The present invention further provides a mask for forming a poly-silicon film, comprising:

plurality of first transparent regions with a spacing S and a plurality of second transparent regions with a spacing S, each transparent region having a width W and a length L;

wherein the first transparent regions are adjacent to the second transparent regions and a central line of each first transparent region extends along the length L into one of the second transparent regions such that an offset width OS appears between the first transparent regions and the second transparent regions.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE PREFERRED EMBODIMENT

The present invention providing a method for forming a poly-silicon film can be exemplified by the preferred embodiment as described hereinafter.

In the present invention, sequential lateral solidification (SLS) with two laser irradiations is employed using a mask for patterning the laser beam so as to increase the grain length.

Figure 4A:
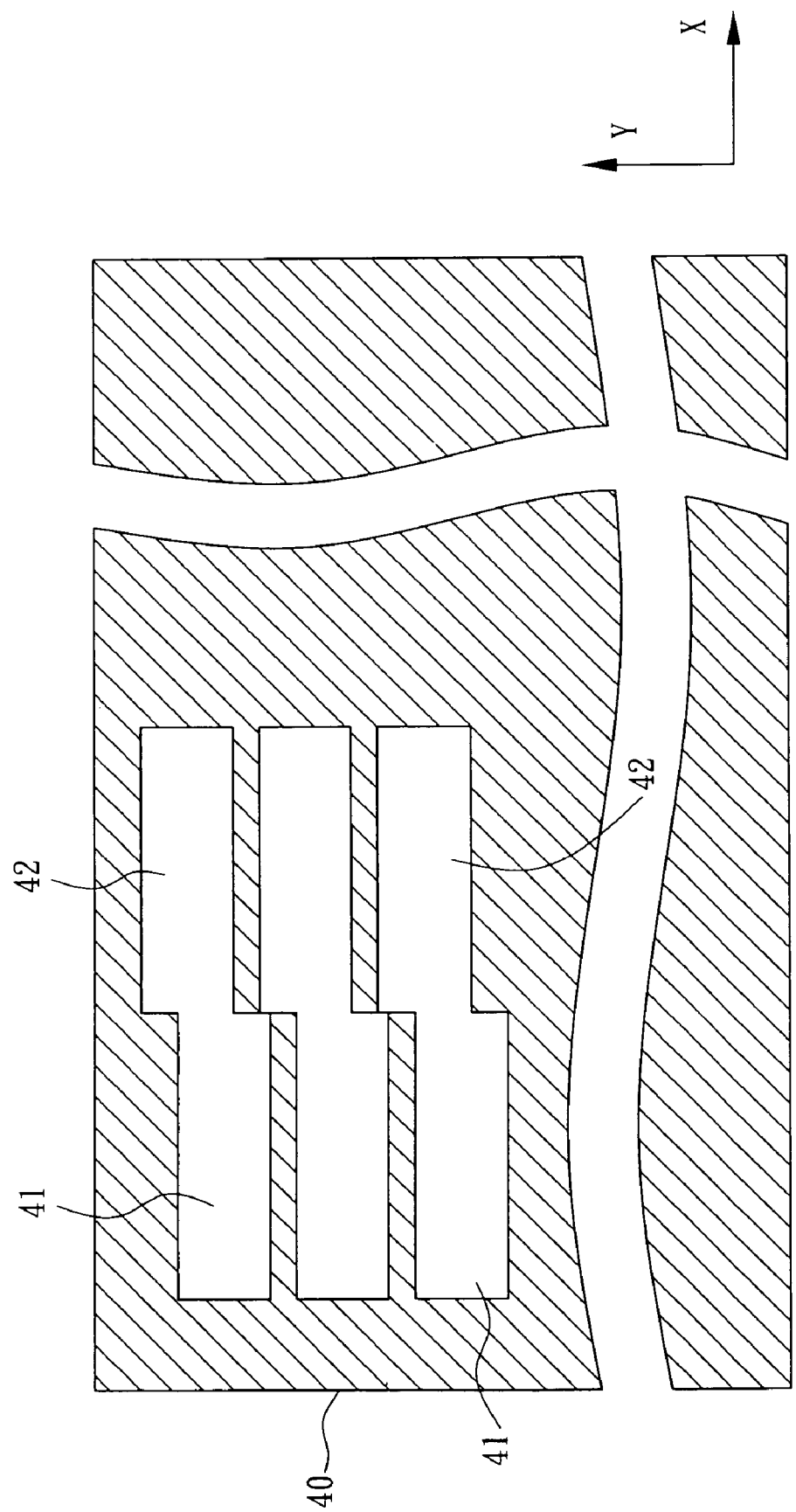
FIG. 4A is a top view of a mask according to the present invention.
Figure 4B:
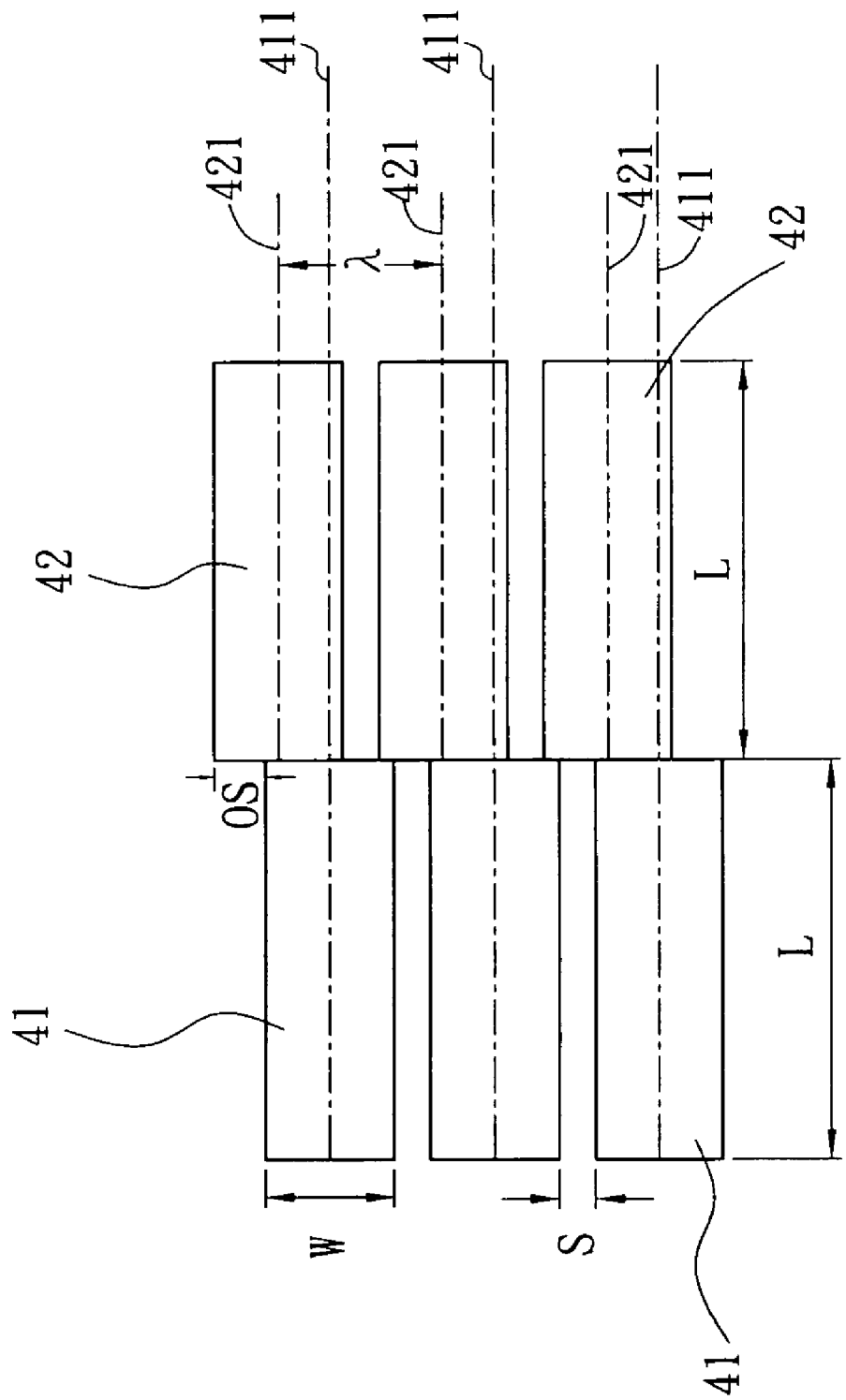
FIG. 4B is an enlarged top view with detailed specification of the mask according to the present invention.
Figure 4C:
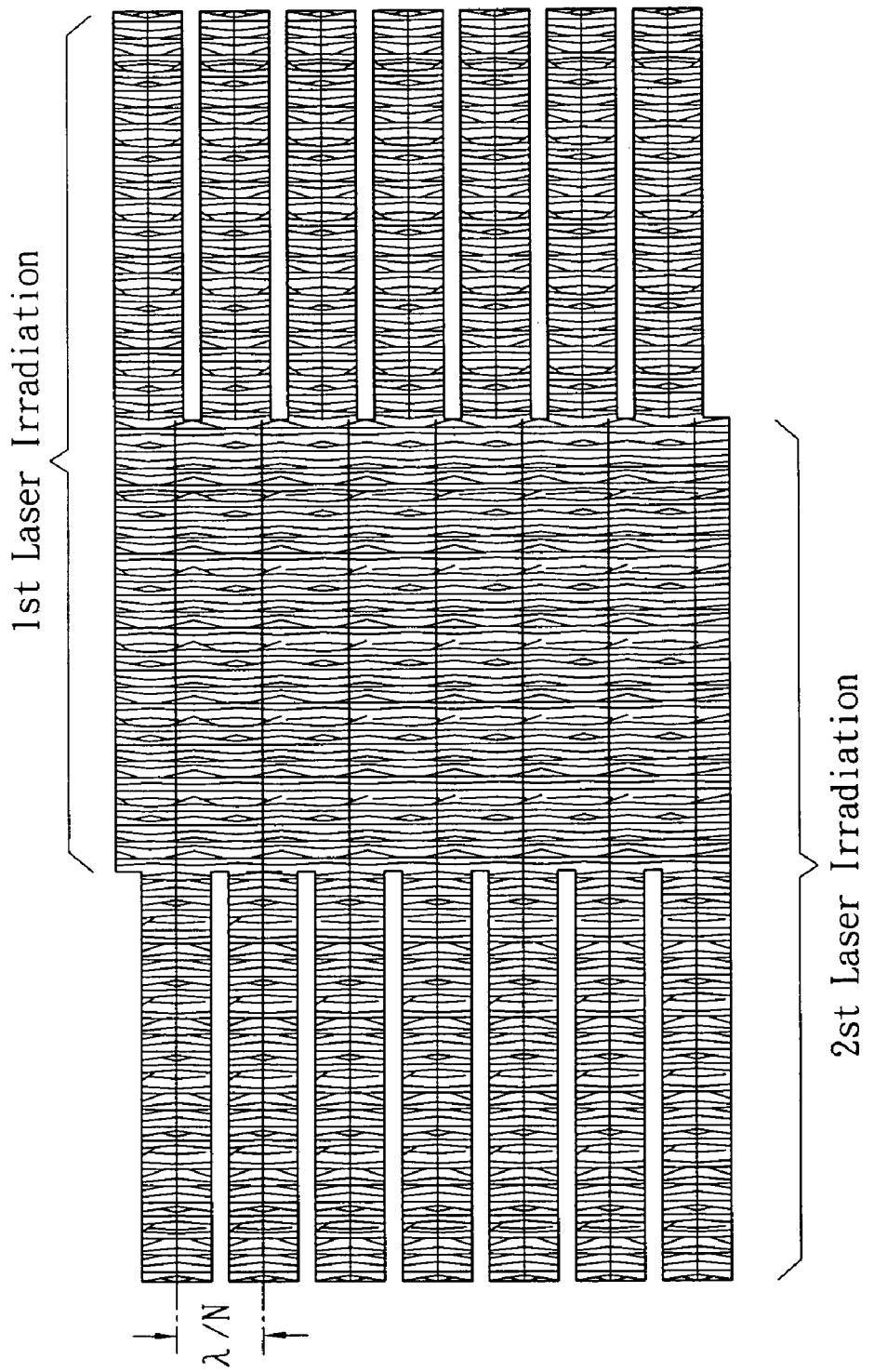
FIG. 4C is a top view of a p-Si film formed using the method using sequential lateral solidification with two laser irradiations according to the present invention.

FIG. 4A and FIG. 4B show a top view of a mask and detailed specification thereof according to the present invention; and FIG. 4C is a top view of a p-Si film formed using the method using sequential lateral solidification with two laser irradiations according to the present invention.

In FIG. 4A and FIG. 4B, the mask 40 comprises a plurality of first transparent regions 41 with a spacing S and a plurality of second transparent regions 42 with a spacing S. Each of the first and the second transparent regions 41 and 42 has a width W and a length L. The first transparent regions 41 are adjacent to the second transparent regions 42 and a central line 411 of each first transparent region extends along the length L into one of the second transparent regions 42 such that an offset width OS appears between the first transparent regions 41 and the second transparent regions 42.

Figure 5:
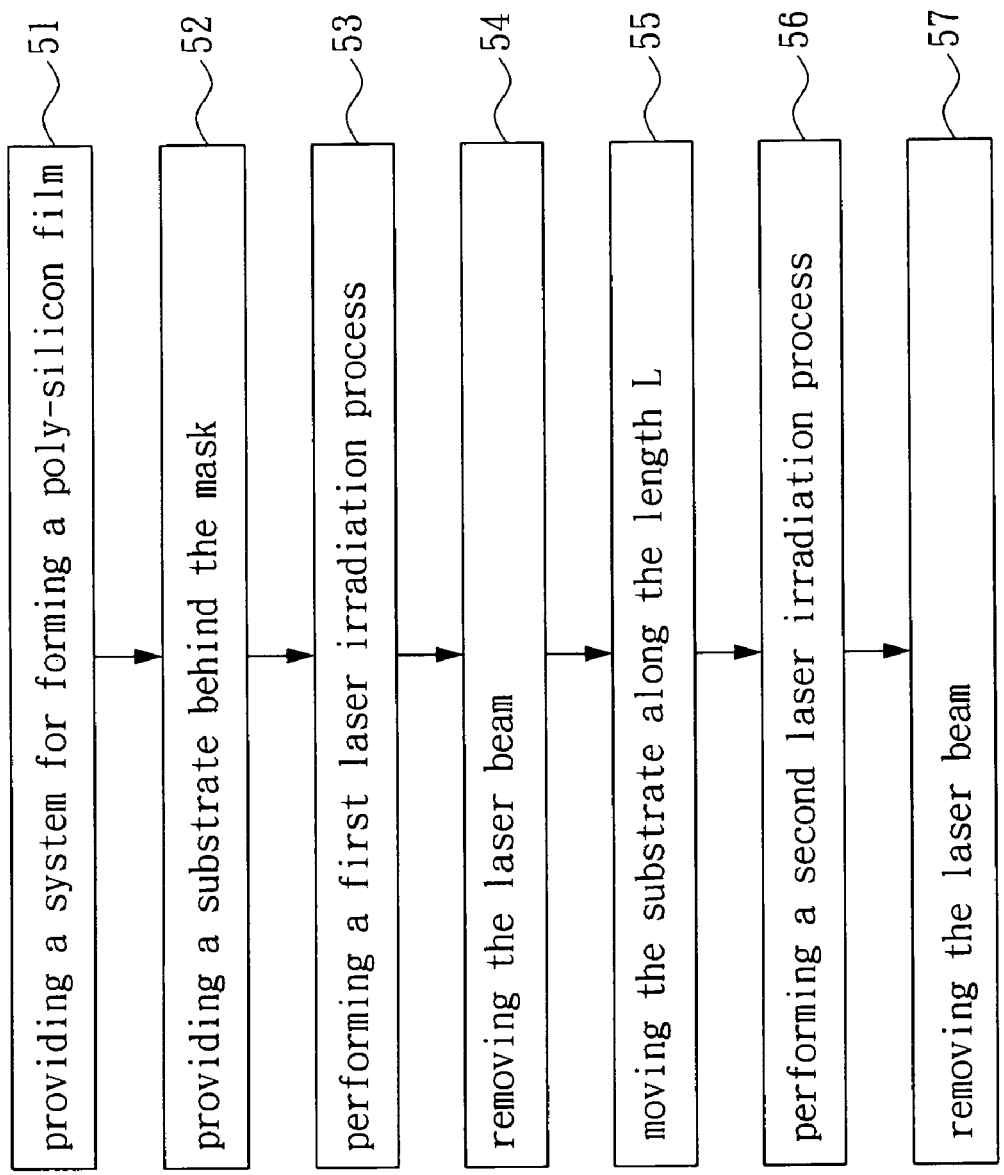
FIG. 5 is a flow chart showing a method for forming a p-Si film according to the present invention.

Therefore, the present invention provides a method for forming a p-Si film using the mask 40 described in FIG. 4A and FIG. 4B and the method comprises steps with reference to the steps described in FIG. 5, which is a flow chart showing the method according to the present invention.

Figure 1A:
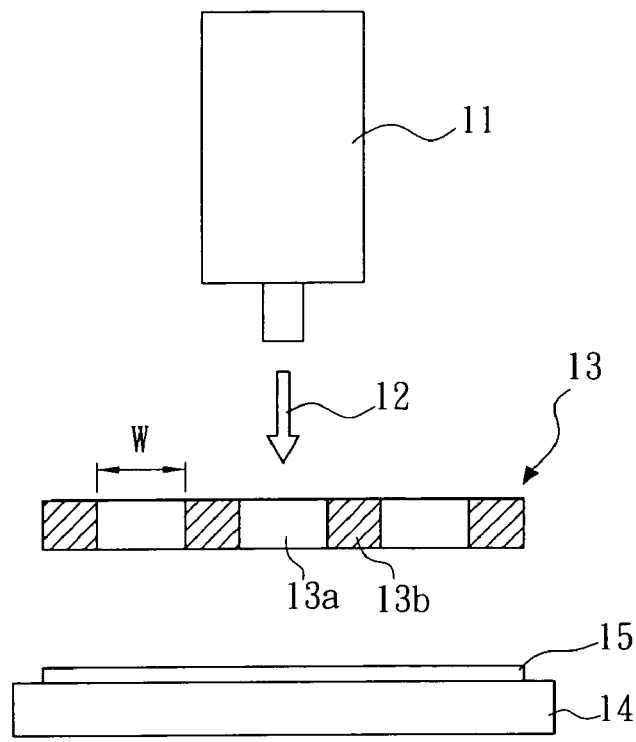
FIG. 1A is a conventional system for forming a p-Si film using sequential lateral solidification (SLS)
Figure 1B:
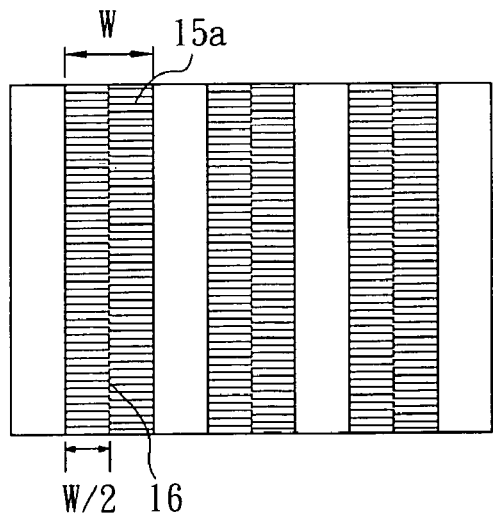
FIG. 1B is a top view of a p-Si film formed using the system in FIG. 1A.
Figure 2A:
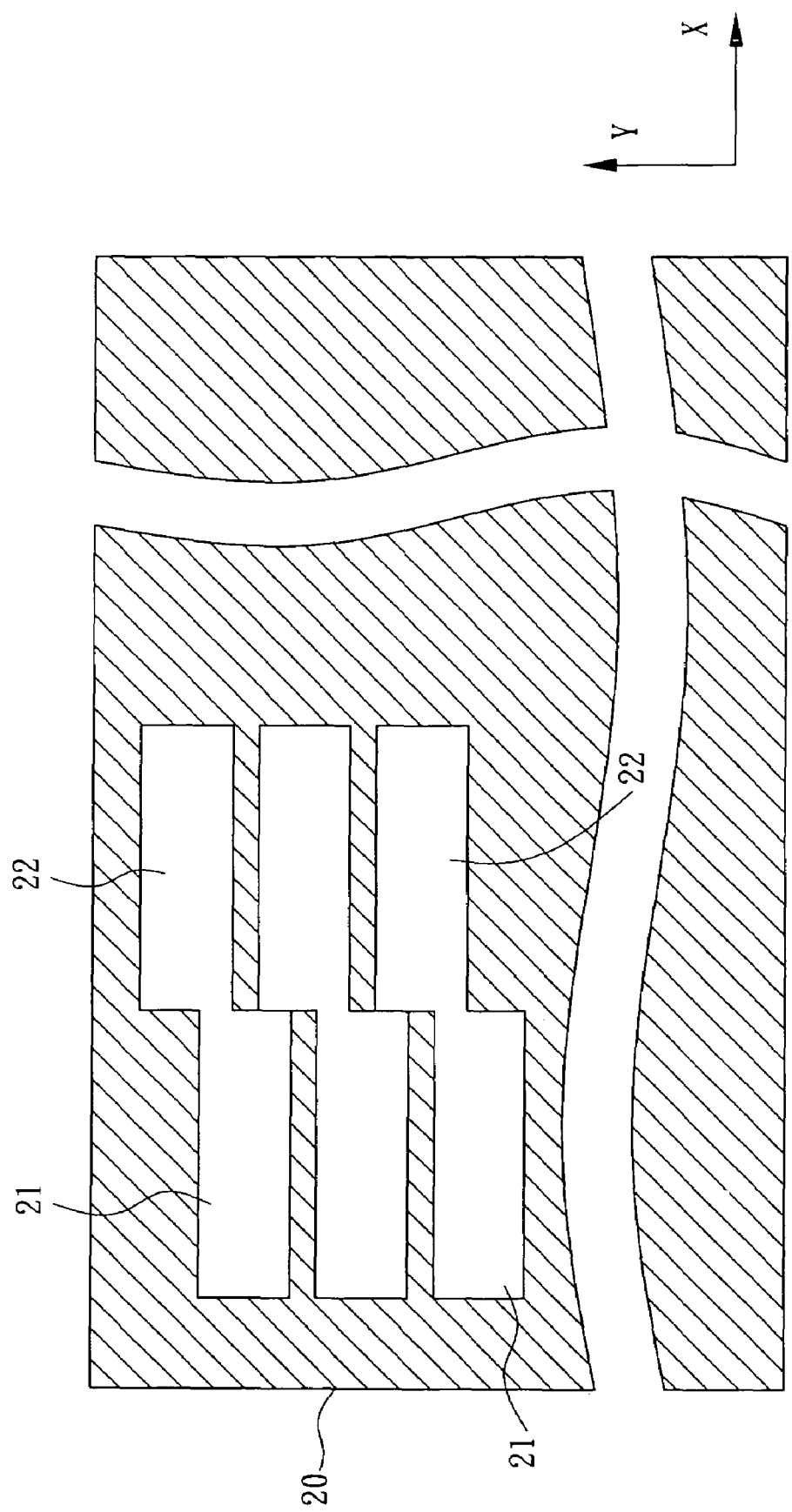
FIG. 2A is a top view of a mask disclosed in U.S. Pat. No. 6,908,835.
Figure 2B:
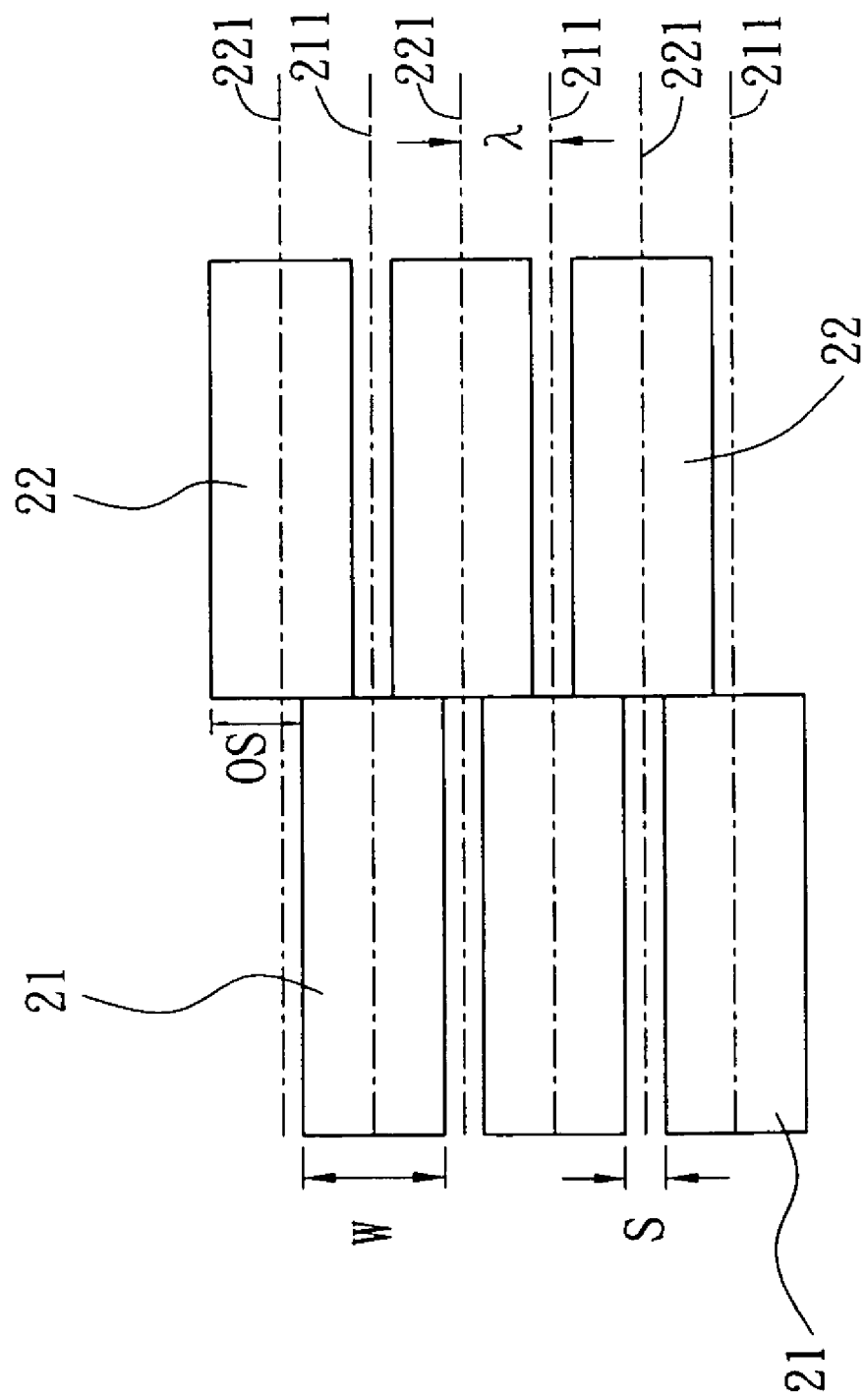
FIG. 2B is an enlarged top view with detailed specification of the mask in FIG. 2A.
Figure 2C:
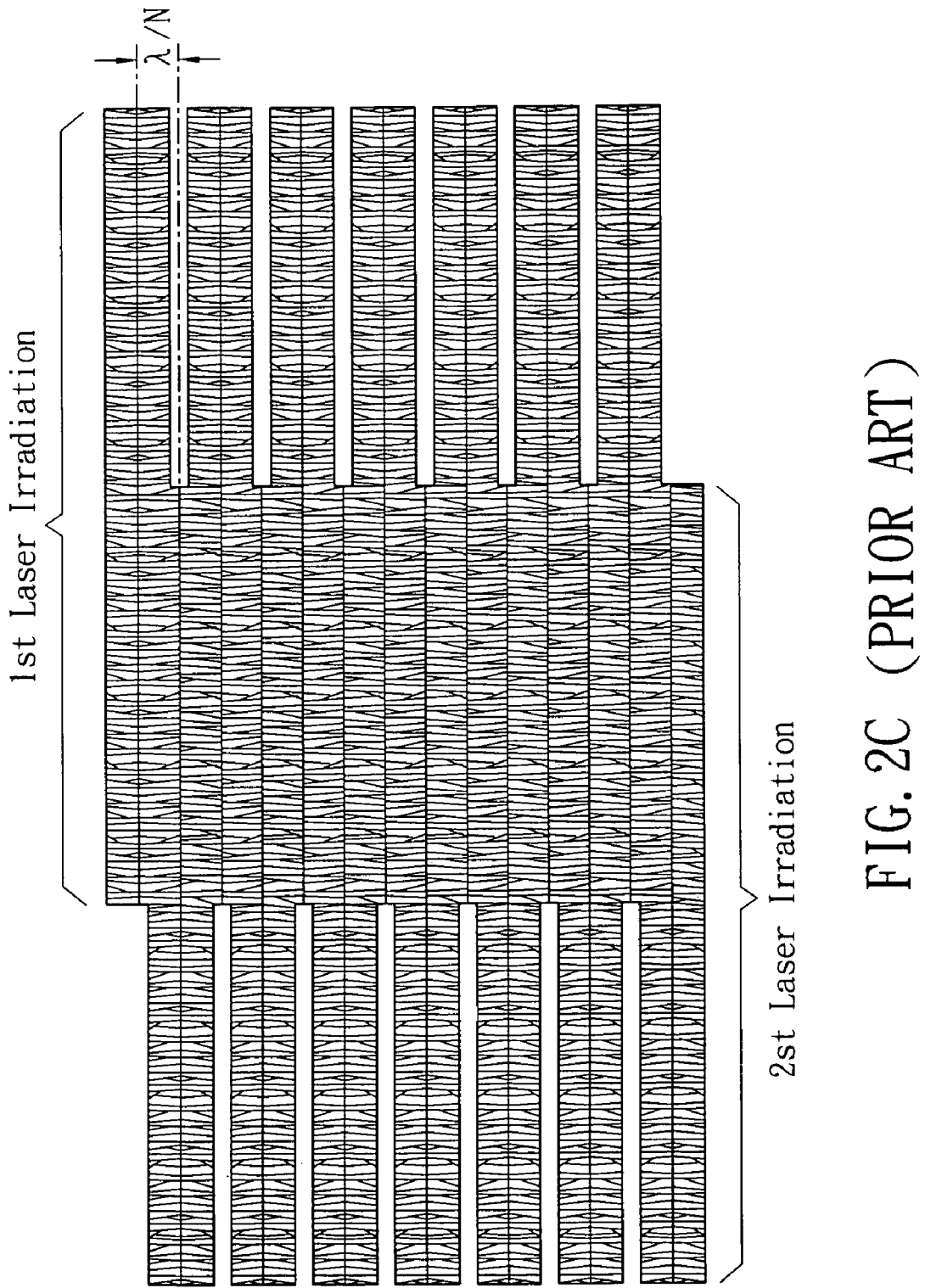
FIG. 2C is a top view of a p-Si film formed using the method using sequential lateral solidification with two laser irradiations disclosed in U.S. Pat. No. 6,908,835.
Figure 3:
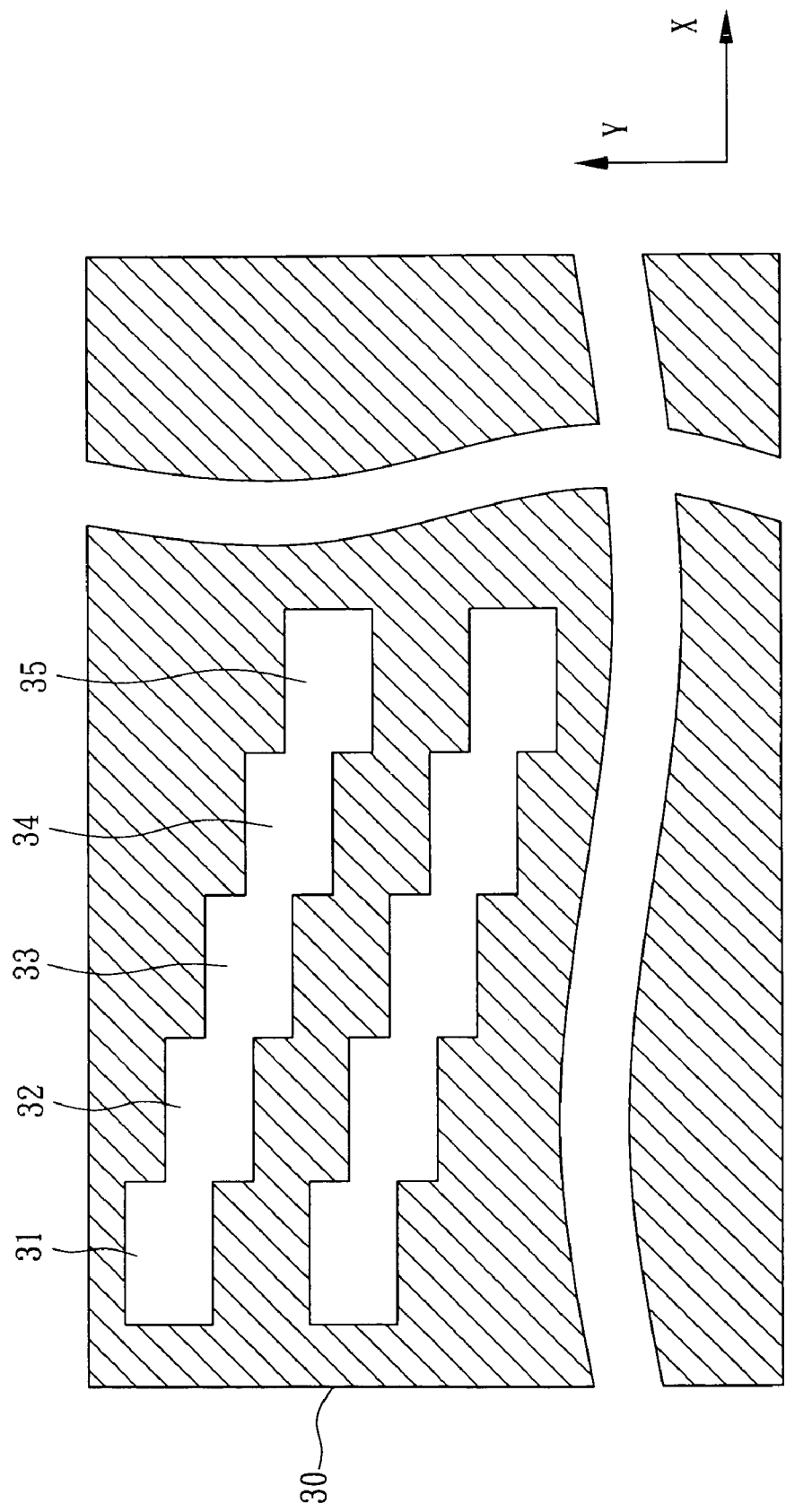
FIG. 3 is a top view of a mask disclosed in U.S. Pat. No. 6,726,768.

First in Step 51, a system for forming a p-Si film is provided to comprise a laser generator for generating a laser beam and a mask. The system is similar to the conventional one shown in FIG. 1 and description thereof is not repeated. However, the mask employed in the present invention is shown in FIG. 4A and FIG. 4B.

In Step 52, a substrate with an a-Si film formed thereon is provided (as shown in FIG. 4C) in back of the mask in the traveling path of the laser beam.

In Step 53, a first laser irradiation process is performed on the a-Si film using the laser beam irradiating through the mask 40 so as to melt the a-Si in a plurality of first stripe-shaped regions corresponding to the first transparent regions 41 on the mask 40.

Then, the laser beam is removed so that the melted a-Si film in the first stripe-shaped regions starts to solidify and turn into a p-Si film with a first grain length, as described in Step 54. First primary grain boundaries are formed on the plurality of first stripe-shaped regions (corresponding to the central line 411 in the first transparent region 41). Meanwhile, the first grain length is equal to a half of the width W.

In Step 55, the substrate is moved along the length L (the a-axis orientation) for a distance no longer than the length L so that the plurality of first stripe-shaped regions correspond to the plurality of second transparent regions 42 on the mask 40.

In Step 56, a second laser irradiation process is performed on the p-Si film using the laser beam irradiating through the mask 40 so as to re-melt the p-Si in a plurality of first stripe-shaped regions corresponding to the second transparent regions 42 on the mask 40.

Finally in Step 57, the laser beam is removed so that the re-melted p-Si film in the first stripe-shaped regions starts to solidify and turn into a p-Si film with a second grain length. Second primary grain boundaries are formed on the plurality of first stripe-shaped regions (corresponding to the central line 421 in the second transparent region 42). Meanwhile, the second grain length $\lambda=W+S$.

In practical cases, however, the system for forming a p-Si film described in Step 51 can further comprise a projection lens apparatus (not shown) disposed on the traveling path of the laser beam between the substrate and the mask. Given that the projection lens apparatus has an amplification factor of N, the grown p-Si film has crystal grains that have a grain length of $\lambda/N$, as shown in FIG. 4C.

Accordingly, the present invention is characterized in that the second laser irradiation re-melts the first primary grain boundaries on the p-Si film solidified after the first laser irradiation and further forms the second primary grain boundaries. Meanwhile, the final grain length is the sum of the width W and the spacing S (i.e., $\lambda=W+S$), i.e., the distance between two second central lines without the projection lens apparatus, while with the projection lens apparatus, the final grain length is $\lambda/N$.

More particularly, in the present invention, if it is given that the width for all the transparent regions 41 and 42 is W=5.5 µm, the spacing between two neighboring first transparent regions 41 is S=0.75 µm and the offset width between the first transparent region 41 and the second transparent region 42 is OS=1.75 µm, the distance between two second primary grain boundaries 421 of the p-Si film after sequential lateral solidification with two laser irradiations is $\lambda=W+S=6.25$ cm without using the projection lens apparatus. However, if a projection lens apparatus with an amplification factor of N=5 is used, the distance between two second primary grain boundaries 421 of the p-Si film after sequential lateral solidification with two laser irradiations is $\lambda/N$ (W+S)/5=6.25 µm if W=27.5 µm, S=3.75 µm and OS=10 µm.

According to the above discussion, it is apparent that the present invention discloses a method for forming a poly-silicon film, using sequential lateral solidification (SLS) with two laser irradiations using a mask for patterning the laser beam so as to increase the grain length. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for forming a poly-silicon film, comprising steps of:
   providing a system for forming a poly-silicon film, comprising
      a laser generator for generating a laser beam; and
      a mask disposed in a traveling path of said laser beam, said mask including a plurality of first transparent regions with a spacing S and a plurality of second transparent regions with a spacing S, each transparent region having a width W and a length L, wherein said first transparent regions are adjacent to said second transparent regions and a central line of each first transparent region extends along said length L into one of said second transparent regions such that an offset width OS appears between said first transparent regions and said second transparent regions, wherein said offset width OS is smaller than a half of said width W;
   providing a substrate with an amorphous silicon film formed thereon behind said mask in said traveling path of said laser beam;
   performing a first laser irradiation process on said amorphous silicon film using said laser beam irradiating through said mask so as to melt said amorphous silicon film in a plurality of first stripe-shaped regions corresponding to said first transparent regions on said mask;
   removing said laser beam such that said melted amorphous silicon film in said first stripe-shaped regions turns into a poly-silicon film with a first grain length;
   moving said substrate along said length L for a distance no longer than said length L such that said plurality of first stripe-shaped regions correspond to said plurality of second transparent regions on said mask;
   performing a second laser irradiation process on said poly-silicon film using said laser beam irradiating through said mask so as to re-melt said poly-silicon film in a plurality of first swipe-shaped regions corresponding to said second transparent regions on said mask; and
   removing said laser beam such that said re-melted poly-silicon film in said first stripe-shaped regions turns into a poly-silicon film with a second grain length.

2. The method as recited in claim 1, wherein said second grain length is (W+S).

3. The method as recited in claim 1, wherein said system further comprises a projection lens apparatus with an amplification factor of N, said projection lens apparatus being disposed on said traveling path of said laser beam between said substrate and said mask.

4. The method as recited in claim 3, wherein said second grain length is (W+S)/N.

5. A mask for forming a poly-silicon film, comprising:
   a plurality of first transparent regions with a spacing S and a plurality of second transparent regions with a spacing 5, each transparent region having a width W and a length L;
   wherein said first transparent regions are adjacent to said second transparent regions and a central line of each first transparent region extends along said length L into one of said second transparent regions such that an offset width OS appears between said first transparent regions and said second transparent regions;
   wherein said offset width OS is smaller than a half of said width W.

* * * * *